(12) United States Patent
Gao

(10) Patent No.: US 12,057,368 B2
(45) Date of Patent: Aug. 6, 2024

(54) COMPONENT PACKAGE FOR HIGH POWER ASIC THERMAL MANAGEMENT

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 377 days.

(21) Appl. No.: 17/341,496

(22) Filed: Jun. 8, 2021

(65) Prior Publication Data
US 2022/0392826 A1   Dec. 8, 2022

(51) Int. Cl.
H01L 23/427 (2006.01)
H01L 21/48 (2006.01)
H05K 7/20 (2006.01)

(52) U.S. Cl.
CPC ........ *H01L 23/427* (2013.01); *H01L 21/4882* (2013.01); *H05K 7/2029* (2013.01)

(58) Field of Classification Search
CPC ............ H05K 7/20218; H05K 7/2029; H05K 7/20518; H05K 7/20627–20636; H05K 7/20663–20672; H01L 21/4882; H01L 23/427

See application file for complete search history.

(56) References Cited

U.S. PATENT DOCUMENTS

| | | | |
|---|---|---|---|
| 2007/0050980 A1* | 3/2007 | Vetter | B23K 11/14 257/E23.098 |
| 2010/0128436 A1* | 5/2010 | Edmunds | F28D 15/0233 165/104.26 |
| 2017/0092565 A1* | 3/2017 | Chen | H05K 7/20281 |
| 2018/0308723 A1* | 10/2018 | Otani | H01L 21/68742 |
| 2020/0100396 A1* | 3/2020 | Iyengar | H05K 7/20254 |
| 2020/0132391 A1* | 4/2020 | Paavola | F28D 15/046 |
| 2021/0407888 A1* | 12/2021 | Elsherbini | H01L 23/467 |

* cited by examiner

Primary Examiner — Jacob R Crum
(74) Attorney, Agent, or Firm — WOMBLE BOND DICKINSON (US) LLP

(57) ABSTRACT

A cooling plate for cooling microchip having redundant cooling fluid circulation. A primary fluid cooling loop removes heat directly from the microchip. A secondary cooling loop acts as a condenser for two phase cells, thus removing heat indirectly from the microchip. The cold plate may be fabricated as two parts bottom plate and top plate, wherein the primary cooling loop is formed in the bottom plate and the secondary cooling loop is formed in the top plate. Two-phase, self-contained cells may be immersed in the primary cooling loop and act to transport heat from the microchip to the secondary cooling loop.

10 Claims, 6 Drawing Sheets

COMPONENT PACKAGE FOR HIGH POWER ASIC THERMAL MANAGEMENT

FIELD OF THE INVENTION

Embodiments of the present invention relate generally to enhanced and reliable cooling of advanced microchips, such as ASIC and other microchips used e.g., in servers within data centers.

BACKGROUND

Cooling is a prominent factor in a computer system and data center design. The number of high performance electronic components, such as high performance processors packaged inside servers, has steadily increased, thereby increasing the amount of heat generated and dissipated during the ordinary operations of the servers. The proper operation of these processors is highly dependent on reliable removal of the heat they generate. Thus, proper cooling of the processors can provide high overall system reliability.

Electronics cooling is very important for computing hardware and other electronic devices, such as CPU servers, GPU servers, storage servers, networking equipment, edge and mobile system, on-vehicle computing box and so on. All these devices and computers are used for critical businesses and are the fundamentals of a company's daily business operations. The design of the hardware component and electronics packaging needs to improve to continuously support the performance requirements. Cooling of these electronic devices becomes more and more challenging to ensure that they function properly by constantly providing properly designed and reliable thermal environments.

Many advanced chips, and especially high power density chips, require liquid cooling. These chips are exceedingly expensive, so that every effort need to be taken to ensure proper heat removal from these chips. Moreover, the liquid cooling equipment must be highly reliable, since any irregularity in heat removal may lead to loss of the chips, causing loss of available computing power during the replacement operation, and even potential impact on the service level agreement which was handled by the lost chips. Importantly, existing solutions for electronics cooling and thermal management for processor do not provide redundancy on the module level, which means that they are a single failure point in the system. Specifically, failure to properly circulate cooling fluid within the cooling plate can lead to a failure of the corresponding processor. Therefore, enhanced reliability may be achieved by developing full end to end redundant cooling solutions for the chips, such that a single failure can be backed up by the designed in redundancy.

While liquid cooling solution must provide the required thermal performance and reliability, since data centers may have thousands of chips requiring liquid cooling, the cost of the liquid cooling system must remain acceptable. The cost of liquid cooling systems may include the cost of introducing redundancy to enhance reliability. Additionally, since different chips have different cooling requirements, it would be desirable to provide a cooling design that is adaptable and expandable to fit different server architectures and be compatible with different chip packaging.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Incidentally, in the following embodiments similar elements are identified with similar reference numbers in the formal x ##, wherein the first digit x is replaced by the same digit as the figure number, while the next two digits ## are maintained consistent among the embodiments. Consequently, explanation of previously disclosed elements may not be repeated in subsequent embodiments.

Disclosed embodiments provide cooling plate for electronic devices, which utilizes multiple circulation loops to enhance the reliability of the cooling system. The cooling plate may be implemented for cooling various electronic devices, such as single-chip module (SCM), system on a chip (SoC), multi-chip module (MCM), System in package (SIP), etc. For brevity, these are referred to herein as microchips or simply chips, but any such reference should be understood to include any of these and similar variances of dies and packaging.

In various disclosed embodiments, the cooling plate includes multiple fluid ports that are couple to separate cooling loops. Additionally, the embodiments may incorporate multiple phase cooling cells in parallel with the cooling loops. Such embodiments enhance the cooling capacity of the cooling plate and enhances the reliability of the cooling system. In embodiments where two-phase cooling cells are used, one fluid cooling loop may be used to extract heat directly from the chip, while another fluid cooling loop may be used to extract heat from vapor in the cells as it condenses back to liquid, thus extracting heat indirectly from the chip.

The structure and functions of these and other features would be described below in more details.

Figure 1:
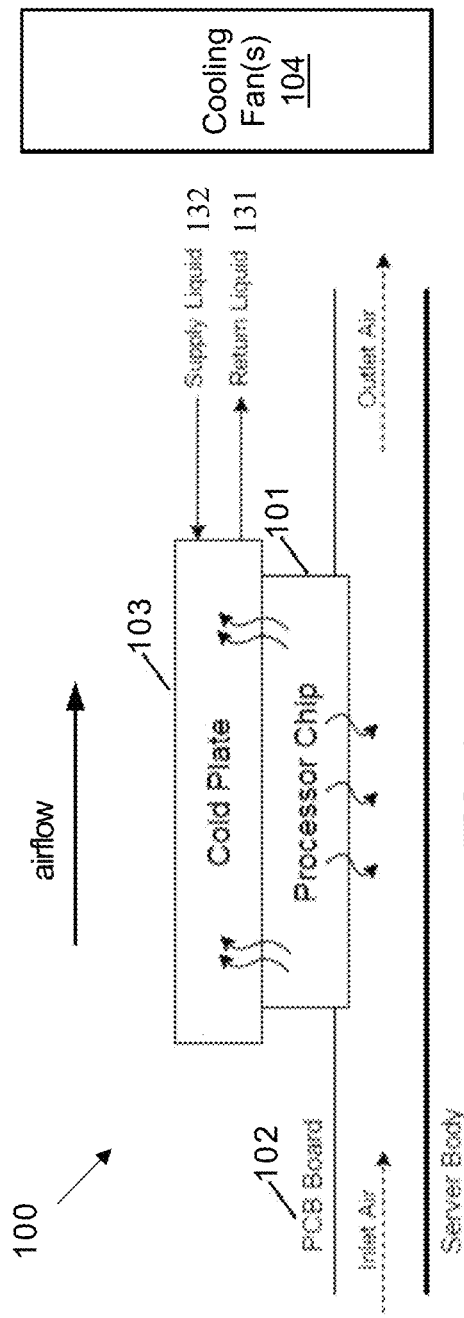
FIG. 1 is a block diagram illustrating an example of a cold plate configuration according to one embodiment.

FIG. 1 is a schematic diagram illustrating a chip cold plate configuration that may be implemented or modified according to embodiments disclosed herein. The chip/cold plate assembly 100 can represent any processors/cold plate structures of servers or other computing platforms incorporating fluid cooling. Referring to FIG. 1, chip 101 (e.g., an ASIC) is plugged onto a socket mounted on printed circuit board (PCB) or motherboard 102 coupled to other electrical components or circuits of a data processing system or server. For fluid cooling, chip 101 also includes a cold plate 103 attached to it, which is coupled to a rack manifold that is coupled to liquid supply line 132 and/or liquid return line 131, e.g., via blind mate connectors. A portion of the heat generated by chip 101 is removed by the cold plate 103. The remaining portion of the heat enters into an air space underneath or above, which may be removed by an airflow generated by cooling fan 104.

Figure 2:
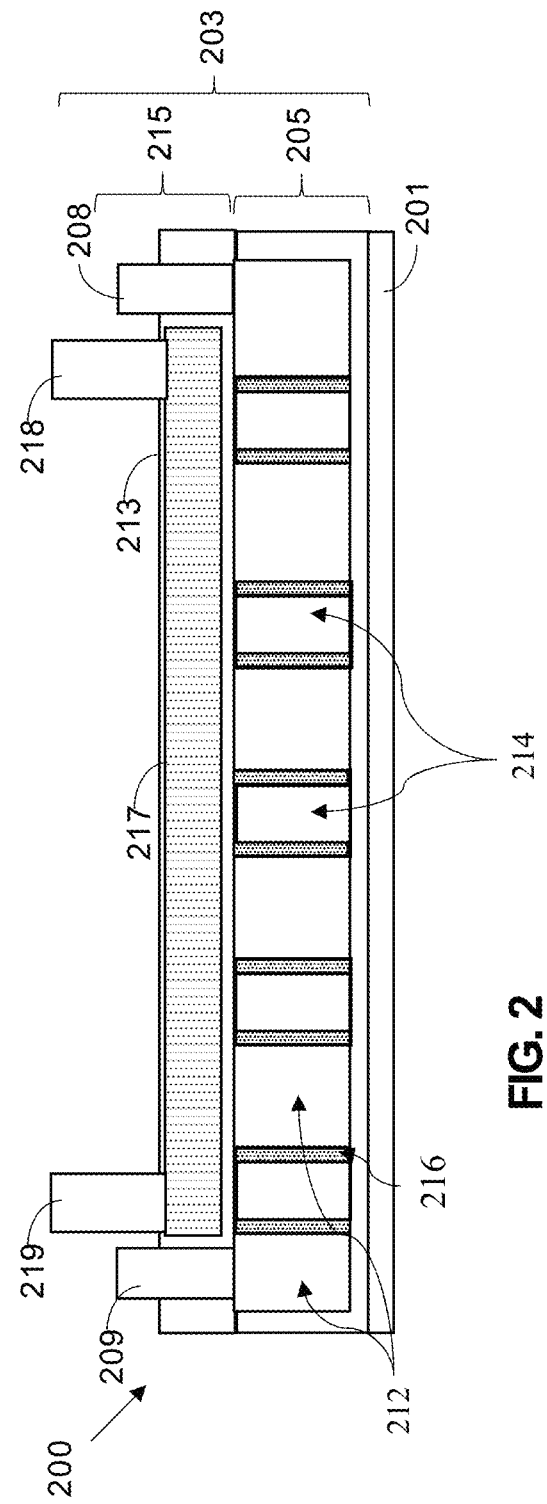
FIG. 2 is a schematic illustrating a cross-section of a cooling plate according to an embodiment.

FIG. 2 is a side cross-section of a cooling assembly 200, which incorporate multiple-loop cooling plate 203. Cooling plate 203 includes a bottom or core plate 205 and a top or secondary plate 215. The bottom plate 205 and top plate 215 may be made of thermally conductive material, e.g., copper, aluminum, etc. The bottom surface of the bottom plate 205 is in physical contact with the chip packaging 201 and the top surface of the bottom plate 205 is in physical contact, e.g., adhered, soldered, welded, etc., with the top plate 215. Notably, the interfaces between the bottom plate 205 and chip 201 and between the bottom plate 205 and the top plate 215 should be made highly thermally conductive.

The bottom plate 205 includes one or more fluid channels 212 through which cooling fluid from a cooling system circulate. Immersed among the fluid channels 212 are a plurality of two-phase cooling cells 214. In one embodiment the channels 212 may be simply defined or formed by the placement and orientation of the cells 214, as will be further shown below. The two-phase cooling cells 214 are self-contained and are sealed, such that no fluid flows into or out of the cells 214. Rather, the fluid at the bottom of each cell get heated up by the chip 201 and evaporation occurs. The vapor rises to the top surface of the bottom plate 205 where it condenses and then flow back down. In this example, this process is enhanced by the provision of wicking material or structure 216 inside the cells 214. Thus, the bottom plate removes heat from the chip 201 partially by the fluid circulating within the fluid channels 212 and partly by the evaporation action inside the two-phase cells 214.

In this embodiment, the bottom plate 205 transfers some of the heat removed from chip 201 to top plate 215. The top plate of this embodiment comprises cooling channels 213 that receive circulating cooling fluid, separately from the fluid circulation of the bottom plate 205. Here, the fluid channels 213 of the top plate 215 incorporate fins 217 for enhanced heat removal. As cooling fluid circulates within the top plate 215, it keeps the top plate cold by extracting heat through the bottom of the top plate, thus enhancing the condensation action in the two-phase cells 214 of the bottom plate 205. By this action, the heat removed from the chip 201 by the cells 214 is at least partially delivered to the top plate, such that the fluid in cooling channels 213 indirectly remove heat from the chip.

As shown in FIG. 2, two separate inlet and outlet ports are provided in order to have redundant cooling fluid delivery to the cooling plate 203. Specifically, inlet port 208 delivers cooling fluid to the bottom plate 205 while inlet port 218 delivers cooling fluid to the top plate 215. Similarly, outlet port 209 returns fluid from the bottom plate 205 while outlet port 219 return cooling fluid from the top plate 215. By having this redundancy, even if one fluid circulation system fails, heat can still be removed from the chip by the remaining circulating system. For example, if circulation of fluid in the cooling channels 212 stops, the fluid remaining stationary in the cooling channels 212 would heat up by the heat from the chip 201. Since the fluid in the top plate continues to circulate and keep the top plate cold, the heat from the fluid in channels 212 would be transferred to the fluid circulating in cooling channels 213.

The redundancy of the two cooling fluid loops may be implemented in various ways. For example, different type of cooling fluids may be supplied to the bottom plate and the top plate. The different fluids may be circulated in two separate cooling systems employing independent pumps and conduits. Conversely, the type of fluid may be the same, but may be handled by two separate cooling circulation systems, i.e., flowing in different and separate loops. In this manner, if one cooling fluid circulation system fails (e.g., a pump failure or pump needs to be shut down due to a leak), the circulation would still function in the other system/loop to provide cooling to the microchip.

Thus, an arrangement of a microchip and a cooling plate is provided, wherein the heat generated by the microchip is partially removed directly from the microchip by a first or primary cooling fluid loop, and heat generated by the microchip is also partially removed indirectly from the microchip by a second cooling fluid loop which circulates cooling fluid independently of the primary cooling loop. The second cooling fluid loop indirectly removes heat from the microchip by enhancing condensation in two-phase cells that are immersed in the primary cooling loop.

Figure 3:
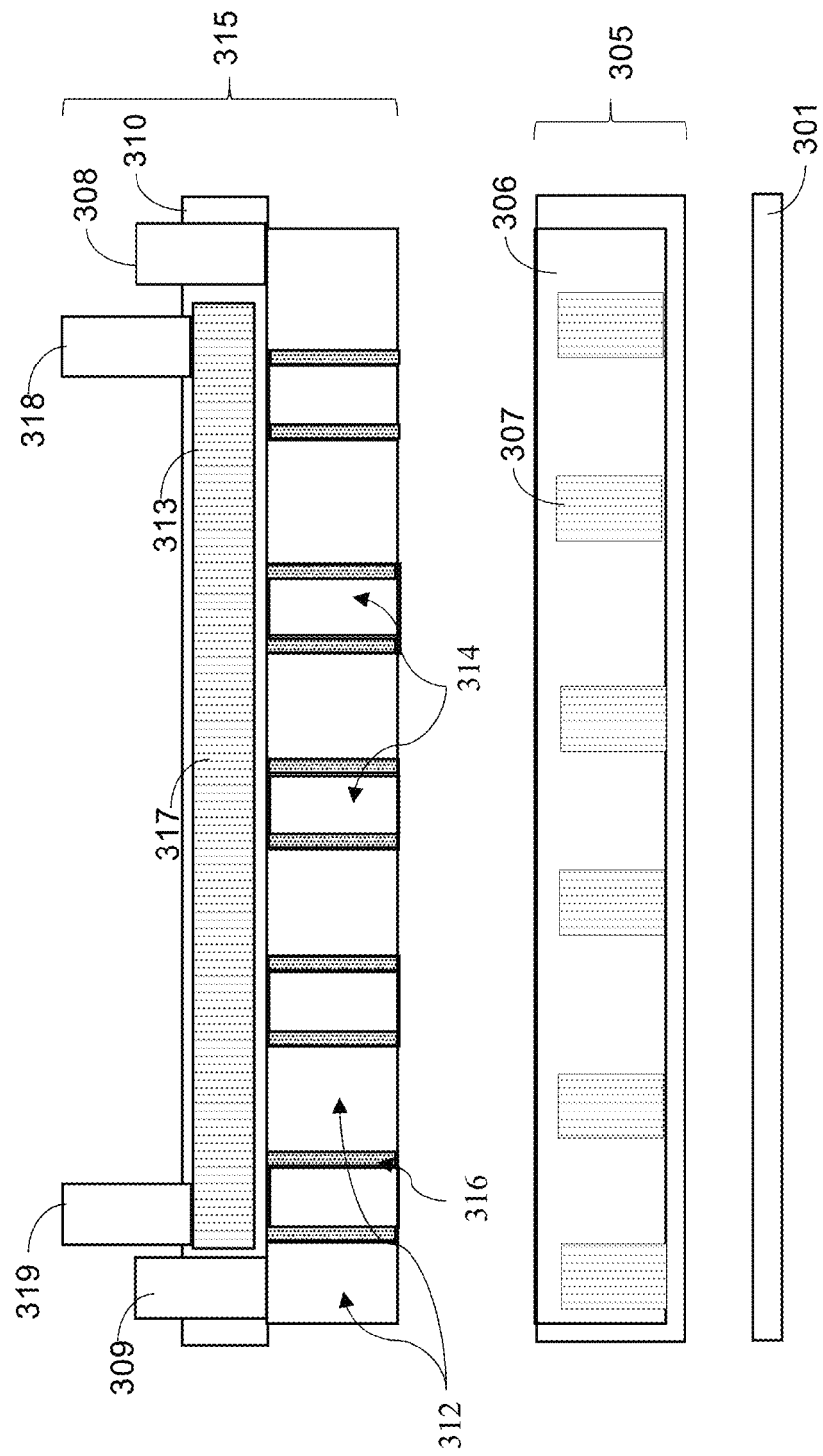
FIG. 3 illustrates an embodiment of fabricating a cold plate, prior to final assembly into a packaged design.

FIG. 3 illustrates an embodiment of the multiple fluid ports cooling plate prior to assembly. FIG. 3 also illustrates the components which can be designed and built, and then assembled together as a cooling package. In one example, the bottom plate 305 is fabricated by forming e.g., milling, a tub or cavity 306 in a plate of metal, such as aluminum or copper. The tub is fabricated to have multiple sets of fins 307. The top plate 315 is fabricated by forming fluid channel 313 in a plate 310, and optionally including fins 317 inside the channel 313. A first set of fluid inlet and outlet ports 318 and 319 are provided in fluid communication with the fluid channel 313. A second set of ports 308 and 309 are formed with an opening to have fluid communication to the tub 306 upon assembly of the bottom and top plates. The second set of ports 308 and 309 do not have fluid communication to the fluid channel 313.

Also, two-phase cells 314 are attached, e.g., welded, to the bottom surface of the top plate 315, thereby ensuring highly thermally conductive interface between the cells 314 and the top plate 315. Further, fluid channels 312 are formed in the top plate 315, in alignment with the fins 307 formed in the bottom plate. Thus, upon assembling the bottom and top plates, the fins 307 are positioned inside the fluid channels 312. The two-phase cells 314 are formed in alignment so as to be immersed in the primary cooling fluid and be positioned among the fins 307 upon assembly of the bottom and top plates. The shape, positioning and orientation of the two-phase cells 314 can be used to define the fluid channels 312. That is, the fluid flowing in the bottom plate would follow the paths defined by the fins 307 and the cells 314, thus the fins 307 and the cells 314 together define the channels 312. Each of the cells 314 may incorporate wicking structure 316. Once the bottom and top plates are assembled together, they may be attached to chip 301.

Thus, a method for fabricating a cooling plate for microchip is provided, comprising: providing a first metal plate and forming primary cooling channel in the first metal plate to thereby fabricate a bottom plate; providing a second metal plate and forming secondary cooling channel to thereby fabricate a top plate; fabricating a first set of inlet and outlet ports in the top plate, the first set having fluid passage to the secondary cooling channel; fabricating a second set of inlet and outlet ports in the top plate, the second set having an opening at bottom surface of the top plate to form fluid passage to the primary cooling channel upon attachment of the top plate to the bottom plate; and, attaching the top plate to the bottom plate.

Figure 4:
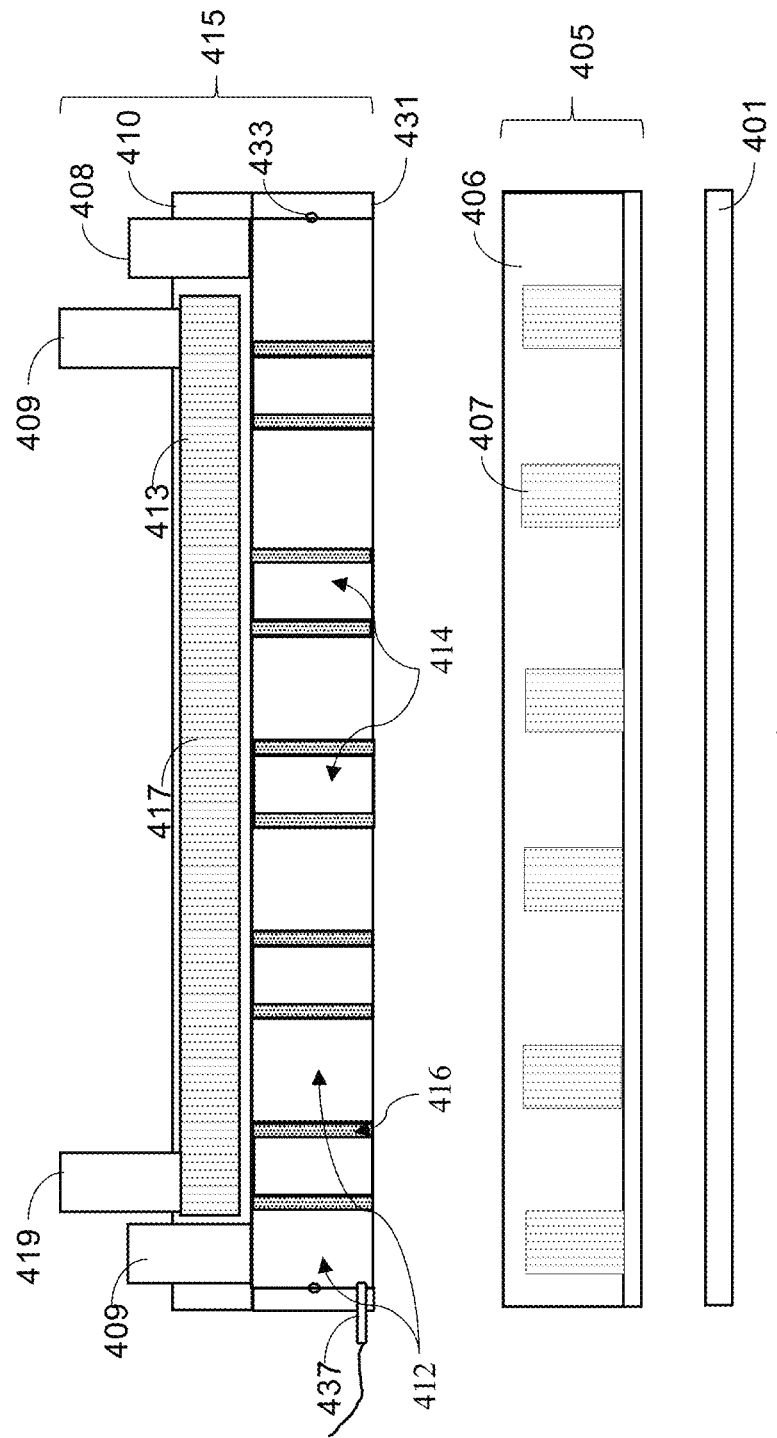
FIG. 4 illustrates another embodiment of fabricating a cold plate, prior to final assembly into a packaged design.

FIG. 4 illustrates another example of fabricating a cooling plate, and is shown prior to final assembly, as well as the entire packaging design. The design of FIG. 4 is somewhat similar to that of FIG. 3, except that in FIG. 4 the top plate incorporates an exterior frame 431. The exterior frame may incorporate different sealing mechanisms, such as O-ring 433 and/or leak detectors such as liquid sensor 437.

Thus, according to disclosed embodiments, a cooling plate for cooling microchips is provided, comprising: a bottom plate incorporating a primary fluid cooling arrangement; a top plate attached to the bottom plate and having a secondary fluid cooling arrangement fluidly separated from the primary fluid cooling arrangement, wherein the secondary fluid cooling arrangement comprises fluid cooling channels formed in the top plate, a fluid inlet port fluidly coupled to the fluid channels and a fluid outlet port fluidly coupled to the fluid channels.

Figure 5:
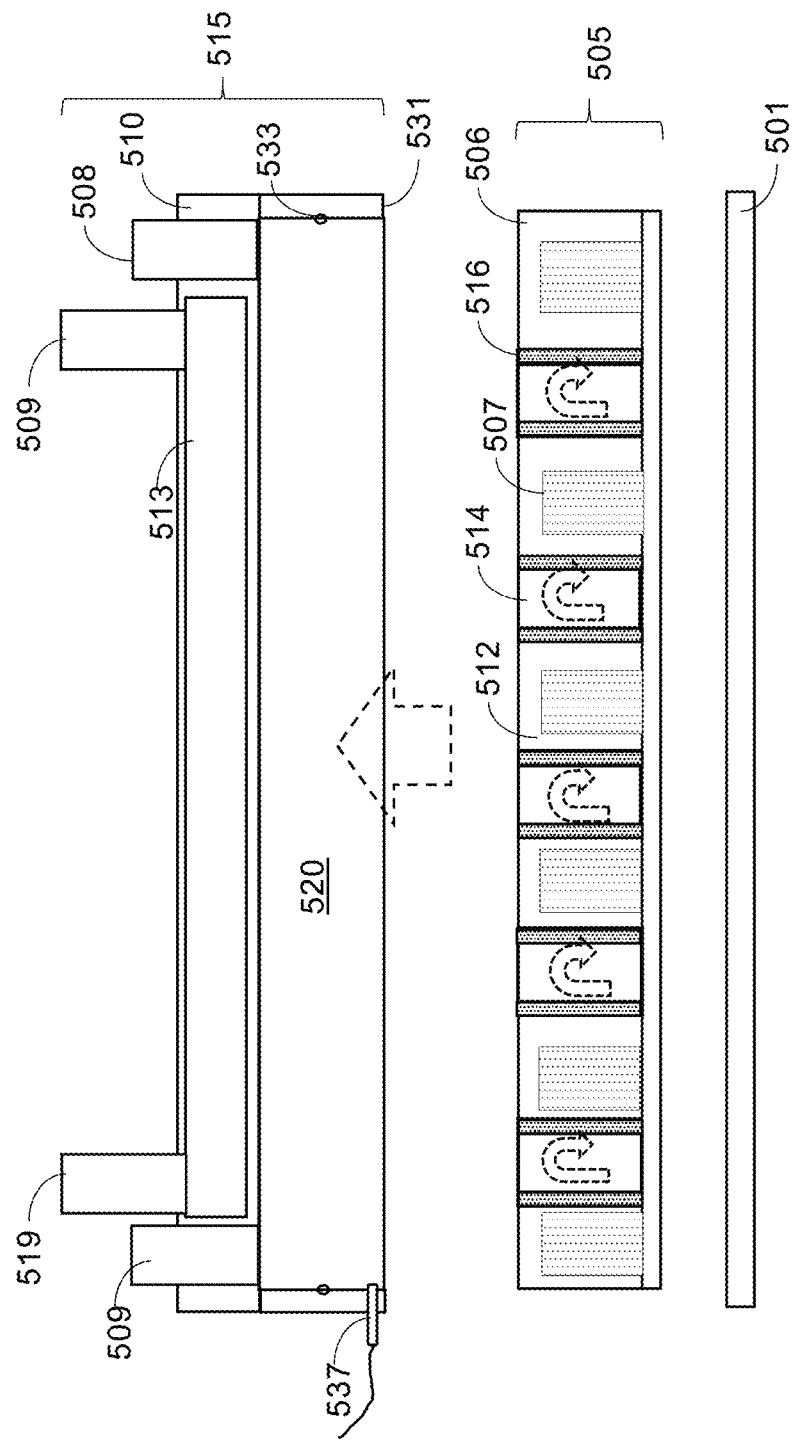
FIG. 5 illustrates yet another embodiment fabricating a cold plate, prior to final assembly into a packaged design.

FIG. 5 illustrates yet another embodiment for fabricating and assembling the cooling plate. In the embodiment of FIG. 5, the fluid channels 512, the fins 507, and two-phase cells 514, including the wicking structure 516, are all fabricated on the bottom plate. Incidentally, the dotted curved arrows indicate the self-contained circulation of the fluid within the two-phase cells 514. In this embodiment, the two sets of intake and outlet ports, 508, 509, 518 and 519 are provided on the top plate 515, but as in other embodiments, the inlet and outlet ports 508 and 509 lead to the fluid channels 512, while the inlet and outlet ports 509 and 519 lead to the fluid channel 516 and form two separate and independent cooling loops.

Figure 6:
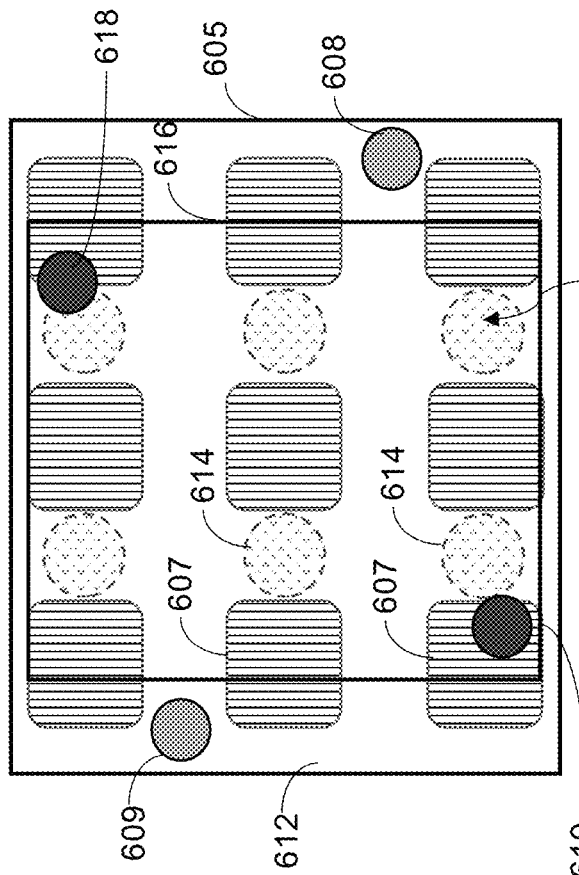
FIG. 6 illustrates a top view of a cooling plate, according to an embodiment.

FIG. 6 is a top "transparent" view of a cooling plate according to an embodiment. In this view some structural elements have been omitted in order to highlight the heat removal function of this cooling plate. For example, the cooling fluid delivered via inlet port 608 is limited to flow within the flow area indicated by 612, the thence flow out via outlet port 609. Meanwhile, fins 607 are provided within the flow area 612 to increase heat delivery to the fluid. The number, size and orientation of the fins can be designed so as to deliver the proper flow resistivity required for proper heat transfer without overloading the pump in the cooling loop.

The two-phase cells 614 may be distributed within the flow area 612, such that some heat may be transferred from the cells 614 to the fluid in area 612. However, much of the heat from the cells 614 is intended to be transferred to the fluid flowing in channels indicated by 613. The fluid is delivered to channel 613 via inlet port 618 and is returned to the loop via outlet port 619, thus transporting the heat from the cells 614 out through outlet port 619. This enhances the condensation action of the fluid within the self-contained two-phase cells 614. This heat transfer and transport can be further understood by reference to FIG. 7.

Figure 7:
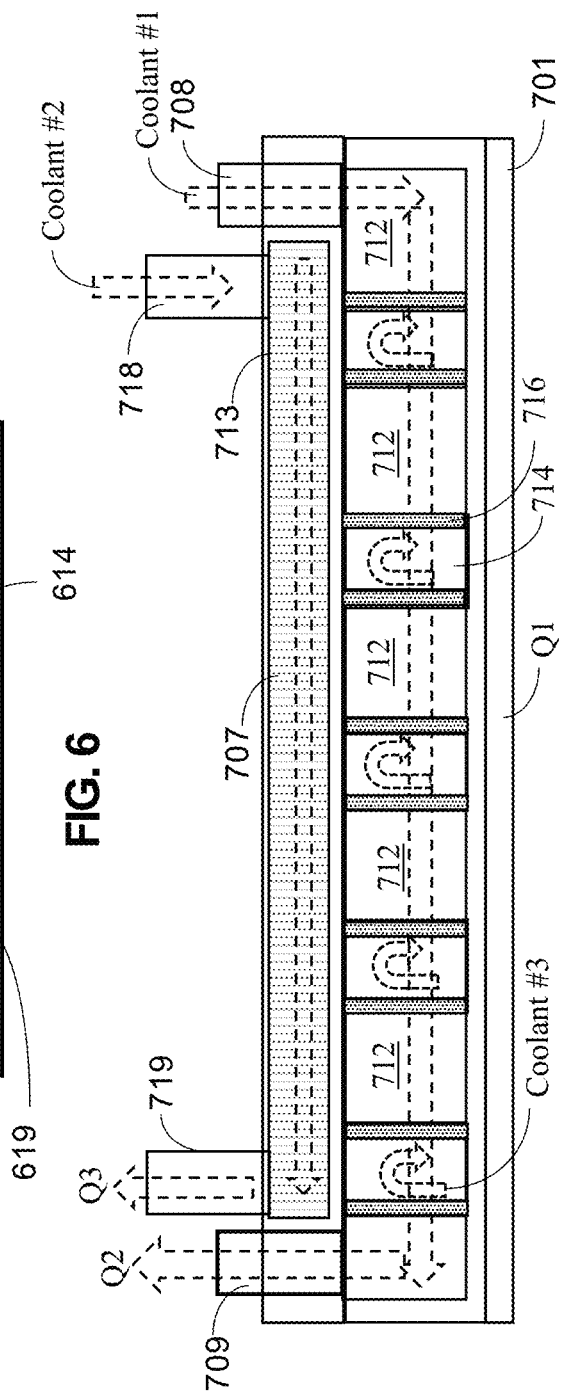
FIG. 7 is a schematic illustrating cooling fluid flow in a cooling plate according to an embodiment.

FIG. 7 schematically illustrates the heat transfer and transport using cooling plates according to disclosed embodiments. In this example, processor 701 generates heat that may be quantized as Q1. Some of that heat, which may be quantized as Q2 is transferred to the cooling fluid indicated as coolant #1 flowing within channels 712. The heat Q2 is then transported out of the cooling plate via outlet port 709. The remainder of heat generated by the processor, quantized as Q3, is transported to the fluid within the two-phase cells 714, which is indicated as coolant #3. The coolant #3 carries the heat Q3 away from the processor by vaporizing and rising to the top of each of the cells 714. At the top of the cells 714 the vapor condenses by transferring the heat Q3 to the cooling fluid flowing within channels 713, and which is identified as coolant #2. Coolant #2 then transports heat Q3 via outlet port 719.

Figures 8, 9:
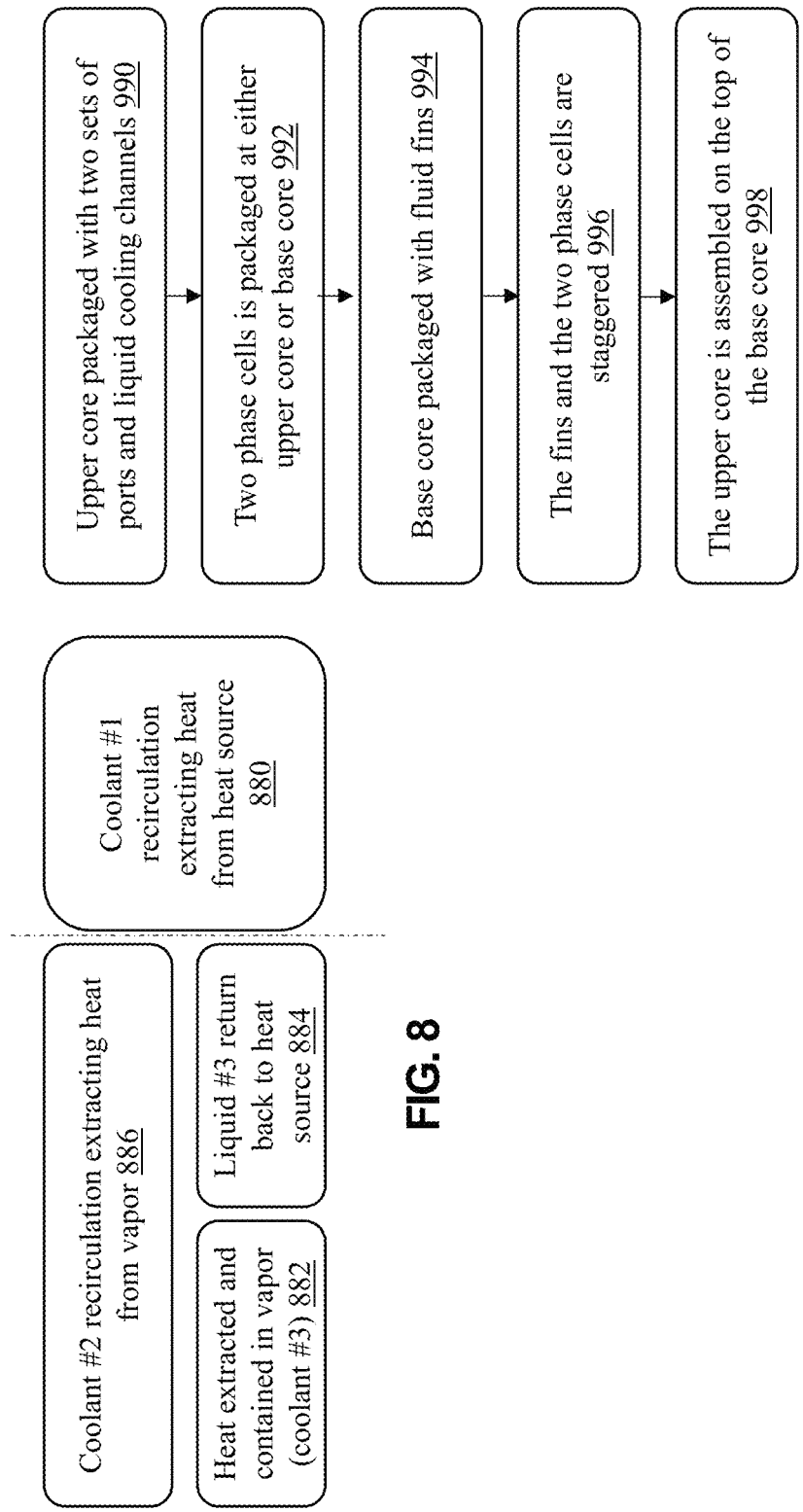
FIG. 8 is a conceptual schematic illustrating the cooling functionality of a cold plate according to an embodiment.
FIG. 9 is a conceptual schematic illustrating the fabrication of a cold plate according to an embodiment.

FIG. 8 is a block chart further illustrating the heat removal using the cooling plate disclosed herein. The dash-dot line indicates the two independent heat removal processes which act independently and simultaneously to provide redundant heat removal loops. To the right of the dash-dot line is the circulation of coolant #1, which circulates within fluid channels of the bottom plate and remove heat directly from the heat source, i.e., the processor. To the left side of the dash-dot line is a two-step process for removing further heat from the source. The first step is the removal of heat by the evaporation of coolant #3 within the two-phase cells. The heat is then transferred from coolant #3 to coolant #2 by the condensation of the vapor of coolant #3. That heat is then transported out by coolant #2, while the condensed coolant #3 flows back to the bottom of each two-phase cell, optionally via the wicking structure. In this sense, fluid #2 indirectly removes heat from the microchip.

FIG. 9 is a general flow chart illustrating the fabrication of the cooling plate according to an embodiment. In step 990 the top plate, also referred to as upper core, is formed with the two sets on inlet and outlet ports. Also, cooling channels for the coolant #2 are formed within the upper core. At 992 the two-phase cells are formed and attached either to the upper or the lower (also referred to as base) core. Also, fluid channels for the coolant #1 are formed in the base core. Optionally, at 994 fins are also formed inside the fluid channels of the base core. As indicated in 996, the fins for the base core and the two-phase cells are staggered, alternate, or interlace, so that the two-phase cells fit in between the fins. In 998 the two cores are aligned and attached together, such as via welding, soldering, adhering etc. For example, indium paste can be placed on mating surfaces and the two cores can be pressed together for a cold weld or annealed in an oven for hot weld.

Thus, by the disclosed embodiments, a cooling device incorporating two independent cooling channels is provided. The cooling device comprises a bottom plate having primary fluid channels for directly removing heat from the microchip. A top plate is attached to the bottom plate and includes a secondary cooling channels for indirectly removing heat from the microchip and for providing redundant cooling loop. Therefore, two sets on fluid inlet and outlet ports are provided, one set for circulating cooling fluid in the primary channel and one set for circulating fluid in the secondary channel. A plurality of two-phase cells are provided in the bottom plate that, by evaporation and condensation action of the fluid contained therein transfer heat from the microchip to the fluid circulating in the secondary fluid channels. The cooling device is attached to a microchip or incorporated in microchip packaging.

According to further disclosed aspects, method for fabricating a cooling plate for microchip is provided, comprising: providing a first metal plate and forming primary cooling channel in the first metal plate to thereby fabricate a bottom plate; providing a second metal plate and forming secondary cooling channel to thereby fabricate a top plate; fabricating a first set of inlet and outlet ports in the top plate, the first set having fluid passage to the secondary cooling channel; fabricating a second set of inlet and outlet ports in the top plate, the second set having an opening at bottom surface of the top plate to form fluid passage to the primary cooling channel upon attachment of the top plate to the bottom plate; and, attaching the top plate to the bottom plate.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling plate for cooling microchips, comprising:
   a bottom plate incorporating a primary fluid cooling arrangement, the primary cooling arrangement comprising a first two-phase cooling cell, a second two-phase cooling cell, and a primary fluid cooling channel positioned between the first two-phase cooling cell and the second two-phase cooling cell;
   a top plate attached to the bottom plate and having a secondary fluid cooling arrangement fluidly separated from the primary fluid cooling arrangement, wherein the secondary fluid cooling arrangement comprises fluid cooling channels formed in the top plate, a fluid inlet port fluidly coupled to the fluid channels and a fluid outlet port fluidly coupled to the fluid channels.

2. The cooling plate of claim 1, wherein the primary fluid cooling arrangement comprises a plurality of two-phase cooling cells including the first two-phase cooling cell, the second two-phase cooling cell, and at least one additional two-phase cooling cell.

3. The cooling plate of claim 2, wherein the primary fluid cooling arrangement further comprises:
   a plurality of primary fluid cooling channels including the primary fluid cooling channel and at least one additional primary fluid cooling channel, the plurality of primary fluid cooling channels formed in the bottom plate;
   a primary fluid inlet port fluidly coupled to the primary fluid channels; and
   a primary fluid outlet port fluidly coupled to the primary fluid channels.

4. The cooling plate of claim 3, wherein the plurality of two-phase cells are immersed within the primary fluid cooling channels.

5. The cooling plate of claim 4, wherein the plurality of primary fluid channels comprise cooling fins.

6. The cooling plate of claim 4, wherein the plurality of two-phase cooling cells comprise wicking structure.

7. The cooling plate of claim 2, wherein the secondary cooling channels comprise fins.

8. The cooling plate of claim 1, further comprising a sealing ring provided between the top plate and the bottom plate.

9. The cooling plate of claim 1, further comprising a leak sensor.

10. The cooling plate of claim 5, wherein the cooling fins and the plurality of two-phase cooling cells are arranged in alternating positions.

\* \* \* \* \*